United States Patent
Lafage et al.

(10) Patent No.: US 12,055,588 B2
(45) Date of Patent: Aug. 6, 2024

(54) TESTBENCHES FOR ELECTRONIC SYSTEMS WITH AUTOMATIC INSERTION OF VERIFICATION FEATURES

(71) Applicant: ARTERIS, INC., Campbell, CA (US)

(72) Inventors: Benoit Lafage, Les Lilas (FR); Insaf Meliane, Asnières-sur-Seine (FR); Cyril Habert, Paris (FR); Gregoire Avot, Chaville (FR)

(73) Assignee: ARTERIS, INC., Campbell, CA (US)

( * ) Notice: Subject to any disclaimer, the term of this patent is extended or adjusted under 35 U.S.C. 154(b) by 0 days.

(21) Appl. No.: 17/956,751

(22) Filed: Sep. 29, 2022

(65) Prior Publication Data

US 2023/0111938 A1   Apr. 13, 2023

Related U.S. Application Data

(60) Provisional application No. 63/250,088, filed on Sep. 29, 2021.

(51) Int. Cl.
| | |
|---|---|
| *G06F 11/00* | (2006.01) |
| *G01R 31/302* | (2006.01) |
| *G01R 31/317* | (2006.01) |
| *G01R 31/319* | (2006.01) |

(52) U.S. Cl.
CPC ... *G01R 31/31908* (2013.01); *G01R 31/3025* (2013.01); *G01R 31/31704* (2013.01)

(58) Field of Classification Search
CPC .......... G01R 31/31908; G01R 31/3025; G01R 31/31704
See application file for complete search history.

(56) References Cited

U.S. PATENT DOCUMENTS

| | | | |
|---|---|---|---|
| 2006/0271890 A1* | 11/2006 | Hekmatpour | G06F 30/33 703/16 |
| 2017/0220707 A1* | 8/2017 | Darbari | G06F 30/327 |
| 2023/0252212 A1* | 8/2023 | Klair | G06F 30/327 716/106 |

* cited by examiner

*Primary Examiner* — Christine T. Tu
(74) *Attorney, Agent, or Firm* — Jubin Dana; Dana Legal Services

(57) ABSTRACT

A system and method are disclosed for assembling a testbench for evaluating electronic systems. The method includes assembling large testbenches by using verification features associated with functional components, automatically creating component connections, and statistically checking the testbench prior to generation and simulation. The system includes a computer system that implements the method.

19 Claims, 4 Drawing Sheets

TESTBENCHES FOR ELECTRONIC SYSTEMS WITH AUTOMATIC INSERTION OF VERIFICATION FEATURES

CROSS REFERENCE

This claiming priority to U.S. Provisional Patent Application No. 63/250,088, filed on Sep. 29, 2021, titled PROCESS TO CREATE TESTBENCHES FOR ELECTRONIC SYSTEMS WITH AUTOMATIC INSERTION OF VERIFICATION FEATURES, the entire disclosure of which is incorporated herein by reference.

TECHNICAL FIELD

The present technology is in the field of computer system design and, more specifically, software that creates a testbench for Design Under Test (DUT) of electronic systems.

BACKGROUND

Electronic system designers combine multiple components to build the complete system. In modern systems such as including, but not limited to, a System on a Chip, there can be hundreds and/or even thousands of components in a system. These components may come from various providers such as, different teams from the company that form the assembly, and/or external vendors which provide these components known as "Intellectual Property" (IP). In particular, logic blocks are reusable logic and/or data that describe and implement hardware functionality within a field-programmable gate array (FPGA) or an application-specific integrated circuit (ASIC) design.

The functional verification step of such systems is an extremely complex task. It typically requires logic simulation of the various components of the system as well as simulations of subsystems, and simulations of the complete system. The goal of these simulations is to exercise the "Design Under Test" (DUT) in all possible situations and check that the behavior of every component, subsystem and system composing the DUT is according to the expected behavior.

Therefore, design and verification teams typically develop additional features that are only used during the functional verification of the related DUT, which are known as, verification features. The combination of functional components, verification components and verification features, is called a testbench.

Verification features that electronic system verification teams may need, among others, include: access to internal signals of functional components, binding specific components containing assertions (typically checkers verifying that a set of properties are always true) to functional components, binding coverage metrics into functional components to monitor progress of the verification process.

Assembling testbenches for large system with many functional components and their associated verification features can become tedious, error prone and slow. At this point, the validation team is facing the following problems as it pertains to creating a testbench at the netlist:

(1) Describing the DUT: Giving a representation to the verification features of a DUT, be it a single component or an assembly of many components and subsystems. There is no standardized format for that purpose.
(2) Automate the creation of the verification environment and update it for each new revision of the DUT or of the verification goals.

Thus, there is a need for a process that significantly reduces the complexity of creating a testbench for systems with many components that have been developed by different teams, bought externally, etc. Such a system would also reduce the possibly of making mistakes by automatically associating functional components and accessor components.

SUMMARY

This invention is a process that can be implemented using software that will significantly reduce the time and personnel needed to create testbenches. The invention will help electronic system designers: (1) assemble large testbenches by using machine-readable descriptions of verification features associated with functional components; (2) automatically create most of the connections for these components, or sub-systems, or systems in the testbench; and (3) statically check the testbench prior to generation and simulation.

BRIEF DESCRIPTION OF THE DRAWINGS

To more fully understand the invention, reference is made to the accompanying drawings or figures. The invention is described in accordance with the aspects and embodiments in the following description with reference to the drawings or figures (FIG.), in which like numbers represent the same or similar elements. Understanding that these drawings are not to be considered limitations in the scope of the invention, the presently described aspects and embodiments and the presently understood best mode of the invention are described with additional detail through use of the accompanying drawings.

DETAILED DESCRIPTION

Figure 1:
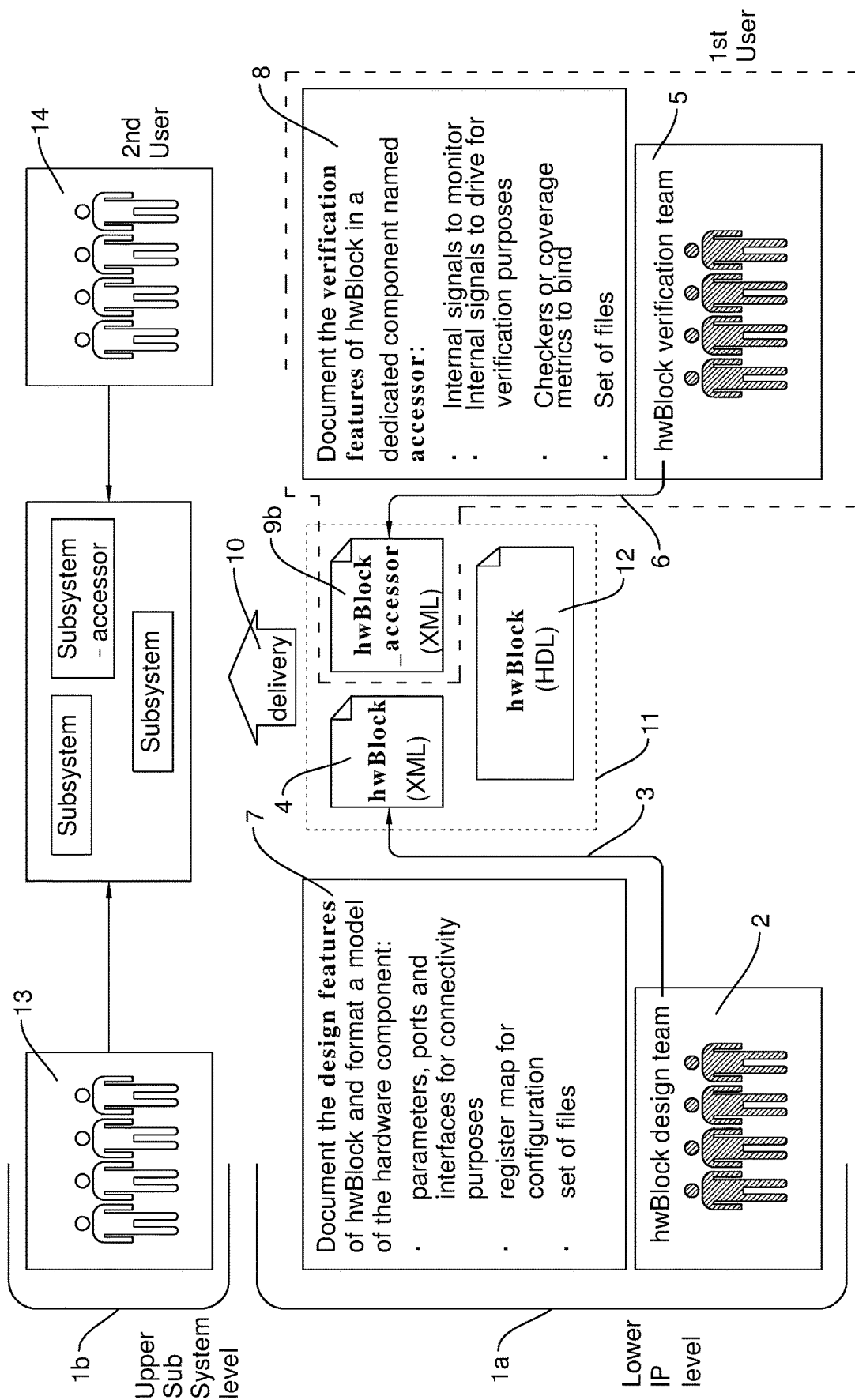
FIG. 1 illustrates the functional Component XML description and associated Verification Components XML description in accordance with the various aspects and embodiments of the invention.

The following describes various examples of the present technology that illustrate various aspects and embodiments of the invention. Generally, examples can use the described aspects in any combination. All statements herein reciting principles, aspects, and embodiments as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

It is noted that, as used herein, the singular forms "a," "an" and "the" include plural referents unless the context clearly dictates otherwise. Reference throughout this specification to "one aspect," "an aspect," "certain aspects," "various aspects," or similar language means that a particular aspect, feature, structure, or characteristic described in connection with any embodiment is included in at least one embodiment of the invention.

Appearances of the phrases "in one embodiment," "in at least one embodiment," "in an embodiment," "in certain embodiments," and similar language throughout this specification may, but do not necessarily, all refer to the same embodiment or similar embodiments. Furthermore, aspects and embodiments of the invention described herein are merely exemplary, and should not be construed as limiting of the scope or spirit of the invention as appreciated by those of ordinary skill in the art. The disclosed invention is effectively made or used in any embodiment that includes any novel aspect described herein. All statements herein reciting aspects and embodiments of the invention are intended to encompass both structural and functional equivalents thereof. It is intended that such equivalents include both currently known equivalents and equivalents developed in the future.

The terms "path" and "route" are used interchangeable herein. Paths includes and are made up of any combination of nodes and edges (edges are also referred to herein as links), along which data travels form source to destination (sink or target). As used herein, a "master," an "initiator," and "source node" refer to similar IP (IP) blocks, units, or modules. The terms "master" and "initiator" and "source node" are used interchangeably within the scope and embodiments of the invention. As used herein, a "slave," a "target," and "sink node" refer to similar IP blocks; the terms "slave" and "target" and "sink node" are used interchangeably within the scope and embodiments of the invention. As used herein, a transaction may be a request transaction or a response transaction. Examples of request transactions include write request and read request.

As used herein, a node is defined as a distribution point or a communication endpoint that is capable of creating, receiving, and/or transmitting information over a communication path or channel. A node may refer to any one of the following: switches, splitters, mergers, buffers, and adapters. As used herein, splitters and mergers are switches; not all switches are splitters or mergers. As used herein and in accordance with the various aspects and embodiments of the invention, the term "splitter" describes a switch that has a single ingress port and multiple egress ports. As used herein and in accordance with the various aspects and embodiments of the invention, the term "merger" describes a switch that has a single egress port and multiple ingress ports.

Referring now to FIG. 1, according to various aspects and embodiments of the invention, shows a process leading up to the creation of simulations to exercise the Design Under Test (DUT) of an electronic system. Here, functional components are described in terms of their connectivity including, but not limited to, interfaces and/or other features, by a machine-readable file or set of files. In one embodiment, the XML schema used is the one defined by the IEEE-1685 standard (IP-XACT). Using this format, a machine-readable description of the functional component interfaces, at minimum, is built.

FIG. 1 illustrates lower IP level 1a having hardware block (hwBlock) Design Team 2 documenting 3 design feature 7 which is retained in (hwBlock) 4 in Extensible Markup Language (XML). Verification feature 8 is developed and documented 6 by Verification Team 5, which is different from Design Team 2. It is within the scope of this invention for Verification Team 5 to be referred to as first user. Verification Team 5 documents 6 verification feature 8, which is retained in a dedicated component called the (hwBlock) second accessor 9b. It is within the scope of this invention for verification feature 8 to include, but not be limited to, an internal signal to monitor, an internal signal to drive for verification purposes, a coverage metric to bind, and/or a file.

The combined work of Design Team 2 and Verification Team 5 is delivered 10 as package 11 having (hwBlock) 12 in Hardware Description Language (HDL), (hwBlock) 4 in XML, and (hwBlock) second accessor 9b in XML. Package 11 is delivered 12 to upper sub-system level 1b. Subsystem Design Team 13 and Subsystem Verification Team 14. It is within the scope of this invention for Subsystem Verification Team 14 to be referred to as second user.

It is within the scope of this invention for a separation of functional components and verification features. Verification features may be developed and documented by different teams other than the ones in charge of the development of functional components that will compose the design under test. As a result, merging functional and verification information in one description by two teams may become a challenging task and may adversely impact the work of the two teams.

To solve this problem, for each functional component, the verification features are encapsulated in one or more dedicated documents owned by including, but not limited to, a verification team.

Figure 2:
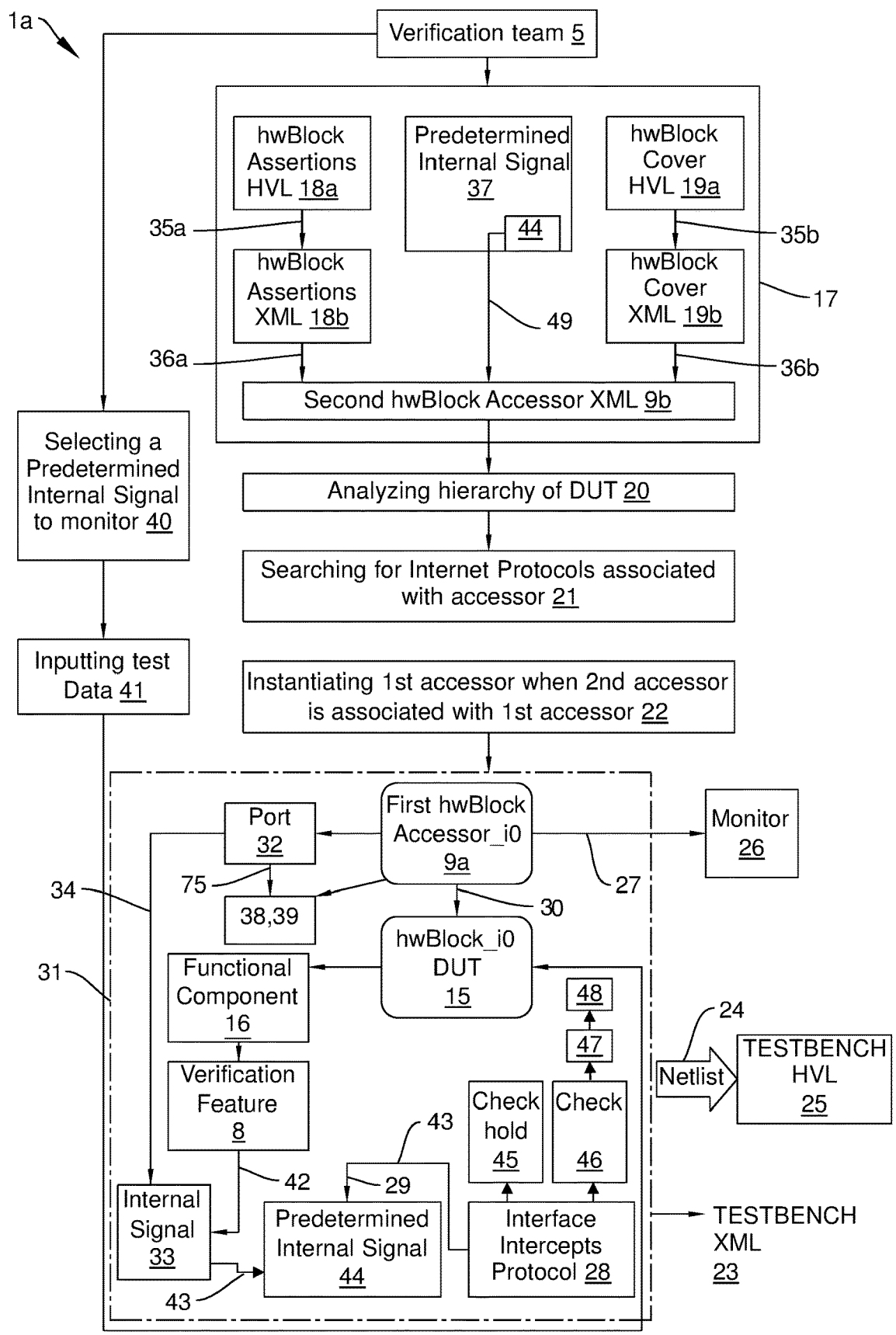
FIG. 2 illustrates the innovative automation steps to assemble a testbench model in accordance with the various aspects and embodiments of the invention.

Referring now to FIG. 2, according to various aspects and embodiments of the invention, shows a description of the novel system at lower IP level 1a. For every verification feature developed to verify the functional component, a machine-readable description of the verification component is built. It contains information needed to perform the required connections between the internal signals of the functional component and the verification component. In one embodiment, the format used to describe the verification component and its needed connections to the internal signals of the functional component is based on the XML standard. In one embodiment, the XML schema used is the one defined by the IEEE-1685 standard. In this invention disclosure, this machine-readable description is called an accessor. A unique identifier mechanism is used to associate unambiguously a functional component with all its accessors. In one embodiment, this identifier is the VLNV property as defined in the IP-XACT IEEE-1685 standard.

Access is added to DUT internal signals. The accessor describes the list of verification-related internal signals. Each internal signal is described using the three following elements: (1) An information container that stores the hierarchical path to the internal signal in the target language (e.g., System Verilog). In one embodiment, this container is called WhiteBox as defined in the IP-XACT IEEE-1685 standard. (2) A port on the accessor to read/write the internal signal from an IP-XACT design. (3) A relation between the port and information container, realized using a vendor extension. Assertions are configured to document assumptions of a designer as well as document the properties of a design. Assertions are used to compare a design's actual behavior to a design's intended behavior in an attempt identify bugs and/or errors that may prevent an electronic system from performing according to its ideal specification.

It is within the scope of this invention for an assertion to be written in System Verilog. There are two kinds of assertions. An immediate assertion is a procedural statement commonly used in simulation models. An assertion is a statement that a verification feature must be true. For example, the pass and fail statement can be any System Verilog simulation model statement. Assertions may be used for including, but not limited to, to write out a message, to set an error flag, to increment a count of errors, and/or to signal a failure directed to a portion of the testbench. The assertions define a list of internal signals of the hardware block (hwBlock). AH of the verification information is retained in a simple block that is netlisted automatically at the end.

In an attempt to monitor verification elements of a design for functional coverage, cover property statements may be used. For example, in a simulation model, a count of the number of times the property in the cover property statement holds 45 or fails 46 is simultaneously activated with the assertion. This can be used to determine whether or not certain aspects of the functionality of the design have been exercised.

Referring again to FIG. 2, a computer-implemented method for creating a test bench for design verification of an electronic system, has the steps of providing test bench 23 having design under test 15. Design under test 15 is electrically connected to computer processor 31m in accordance with some aspects and embodiments of the invention. Design under test 15 has functional component 16. Functional component 16 has verification feature 8 expressed as internal signal 33. Testbench 23 has at least one interface 28. Interface 28 is in communication with verification feature 8. In particular, Interface 28 is connected to 29 the verification IP of design under test 15 and intercepts an IP. Interface 28 is configured to probe design under test 15 for an error. An IP of design under test 15 is configured to be intercepted by interface 28 and corrected 48, through computer processor 31, if an error is detected.

FIG. 2 illustrates first accessor 9a having port 32 connected to 34 internal signal 33 of functional component 16. First accessor 9a describes list 38 having at least one verification-related internal signal 33 of design under test 15. Each verification-related internal signal 33 is described using storage container 39 configured to store a hierarchical path to internal signal 33 in a target language, port 32 configured to read and/or write internal signal 33 from design under test 15, port 32 connects storage container 39 of first accessor 9a to internal signal 33 of design under test 15 to form test bench 23. First accessor 9a is paired 30 to design under test 15 with its IP.

FIG. 2 depicts the next step of the novel computer-implemented method for creating a test bench for design verification of an electronic system providing verification component 17 having at least one assertion statement 18a. Assertion statement 18a is configured to document at least one verification feature of design under test 15. Assertion block HVL 18a is imported 35a to assertion block XML 18b. It is within the scope of this invention for bind specific component 36a to contain an assertion.

Verification component 17 has at least one cover statement 19a. Cover statement 19a is imported 35b to cover block XML 19b. The cover statement is configured to count the number of times verification feature 8 of the assertion statement holds 45 or fails 46. It is within the scope of this invention for bind specific component 36b to contain a cover statement. Second accessor 9b is configured to verify functional component 16 of design under test 15. Second accessor 9b is in communication with assertion statement 18b. Second accessor 9b is in communication with cover statement 19b.

Referring again to FIG. 2, the next step of the novel computer-implemented method for creating a test bench for design verification of an electronic system is pairing the second accessor 9b of verification component 17 with the first accessor 9a of design under test 15 by analyzing 20 by computer processor 31, a hierarchy of device under test 15. Searching 21 by computer processor 31 for an IP associating second accessor 9b with first accessor 9a. Instantiating 22 by computer processor 31, first accessor 9a when second accessor 9b is associated with first accessor 9a. First accessor 9a is paired 30 with associated its design under test 15.

First user 5 may be a member of a verification team and performs the step of selecting 40 at least one predetermined internal 37 or a reference signal. First user 5 then performs the step of storing predetermined internal signal 37 in database 44 of verification component 17. Database 44 is connected to second accessor 9b. First user 5 inputting 41 test data into design under test 15. Interface 28 probing 43 design under test (DUT) 15 for an error. In particular, when probing 43 output data 42, if the correct value in the output data 42, a request for more internal signals will facilitate where the IP problem exists. The IP of design under test 15 is intercepted by interface 28 and corrected 48 by user 5 or automatically, through computer processor 31, if an error is detected. Monitor 26 monitors and/or drives internal signal 33 of first accessor 9a. In an example, a design team will define the behavior or feature and will try to design the system on a chip dependent on the specification defined by the chip architecture. The verification team will have the same specification and will attempt to authenticate and verify that the design team successfully created a design that corresponds to its specification. If the verification team has detected substantially significant signals to monitor, they may share the useful signals with another verification team.

In an alternate embodiment, the computer-implemented method may include the step of providing monitor 26. Monitor 26 is in electrical communication with first accessor 9a. Monitor 26 is configured to measure internal signal 33 of functional component 16.

In an alternate embodiment, the computer-implemented method may include the step of providing at least one dedicated document encapsulating at least one verification feature.

In yet another embodiment, the computer-implemented method may include the step of providing an identifier mechanism associating at least one functional component with a plurality of accessors.

In another embodiment, the computer-implemented method may include the step of second accessor 9b having bind information configured for the instantiation of assertion models when determining functional verification.

In another embodiment, the computer-implemented method may include the step of assertion statement being net listed automatically.

In another embodiment, the computer-implemented method may include the step of requesting 47 (FIG. 2) additional internal signals, by computer processor 31, to facilitate debug 48 if an error is detected.

In an alternate embodiment, the computer-implemented method may include the step of providing a sub-system. A second user receives additional internal signals from a request and accessor from the first user. The second user creates a third accessor from the additional internal signals and the accessor. In an example, if work is being done at an IP level on the information that is put into the accessor for verification, the accessor can also be used at an upper level if the IP is associated in the subsystem. The verification team that will work at the subsystem can reuse the work that has been done by the verification team at the IP level. As a result, the accessor will already have all of the significant signals and significant monitoring parameters that have been defined in the accessor at the IP level. As it relates to FIGS.

1-3, first accessor 9*a* and second accessor 9*b* retain the same information and may be used for both the subsystem level and the chip level.

In one embodiment of the invention, in addition to internal signals connections (drive and monitor), the "accessor" can also include bind information for the instantiation of assertions modules needed for functional verification.

Figure 3:
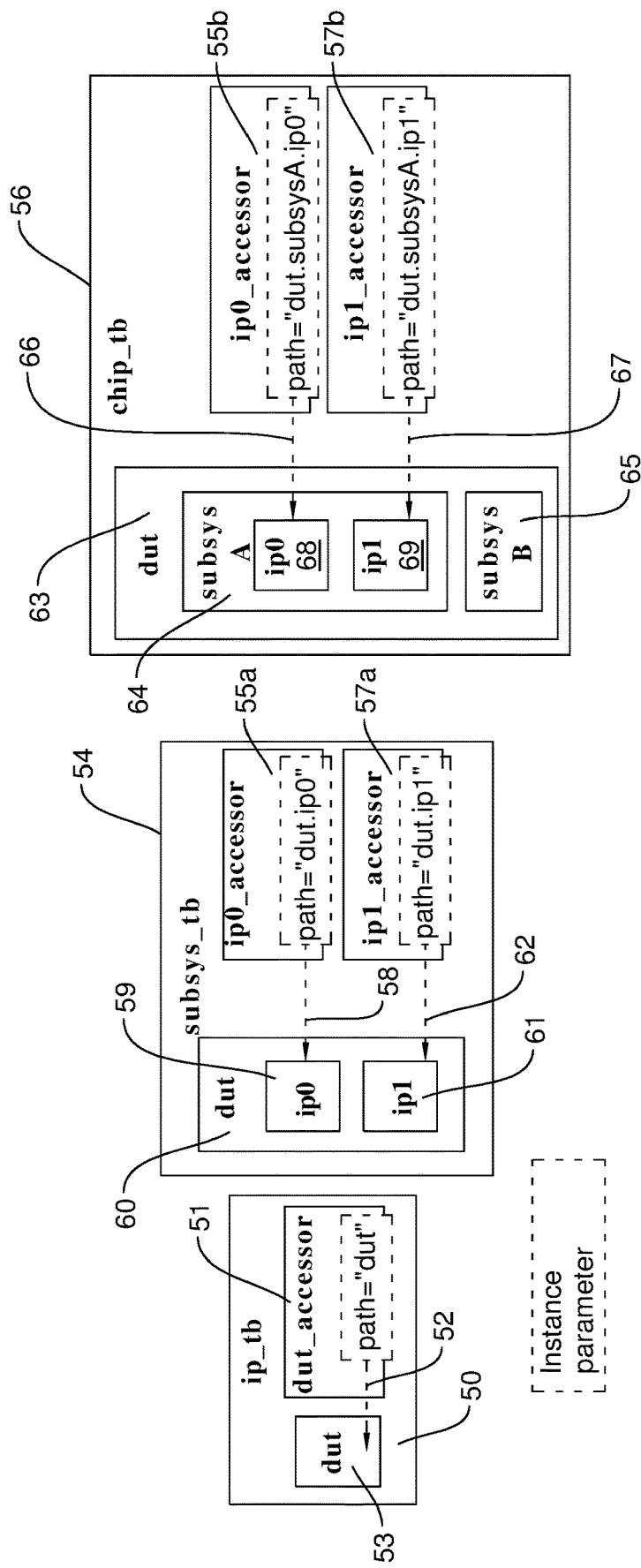
FIG. 3 illustrates the innovative reuse of Verification Components XML description over Various Levels of Testbenches in accordance with the various aspects and embodiments of the invention.

Referring now to model of FIG. 3, according to various aspects and embodiments of the invention, illustrates IP testbench assembly 50 having accessor 51. Accessor 51 is paired 52 with its design under test 53. The same accessor may be used at the chip level and at the subsystem level because the same verification is required. At an upper subsystem level 54, accessor 55*a* is the same as accessor 55*b* at chip level 56. At an upper subsystem level 54, accessor 57*a* is the same as accessor 57*b* at chip level 56. Design under test 60 has IP 59 and IP 61. Accessor 55*a* pairs 58 with its IP 59. Accessor 57*a* pairs 62 with IP 61. Accessor 55*b* pairs 66 with its IP 68. Accessor 57*b* pairs 67 with IP 69. Accessors 55*a* of subsystem level 54 and 55*b* of chip level 56 are the same. Accessors 57*a* of subsystem level 54 and 57*b* of chip level 56 are the same. In chip level 56, design under test has subsystem A 64 and subsystem B 65. In this model, subsystem B does not have an accessor. A subsystem B Accessor may be created by the team working at the IP test bench 50. The accessor has been reused by the team working at subsystem level 54 and by the team working at chip level 56 in the same manner.

Figure 4:
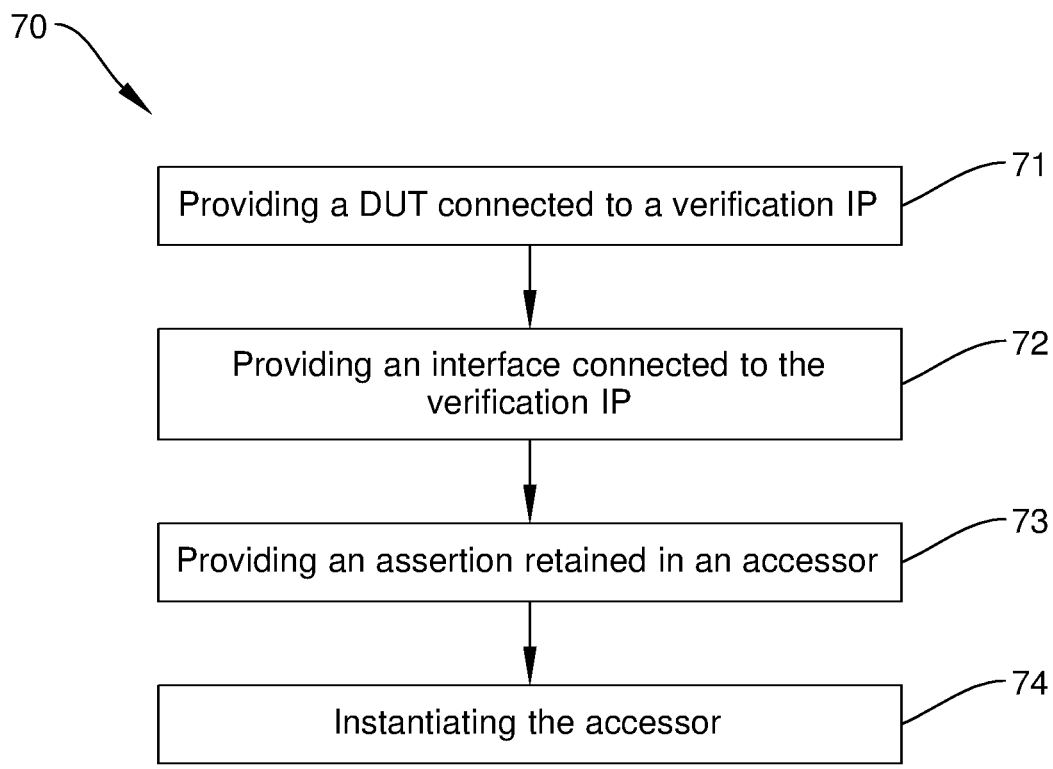
FIG. 4 illustrates a process for design verification of an electronic system in accordance with the various aspects and embodiments of the invention.

Referring now to FIG. 4. FIG. 4 illustrates the steps in novel method for design verification of an electronic system 70 in accordance with various aspects and embodiments of the invention. Novel method for design verification of an electronic system 70 has step 71 of providing a design under test connected to a verification IP to create a test bench. Step 72 provides an interface connected to the verification IP. Step 73 provides an assertion retained in an accessor. The assertion is a list of at least one internal signal of an associated hardware block of the verification IP configured to connect to the test bench. Step 74 instantiates the accessor.

In an alternate embodiment, best illustrated in FIG. 2, verification IP 17 may have cover statement 19*a*, 19*b*.

In another embodiment shown in FIG. 2, verification IP 17 has internal reference signal 37 configured to be driven and/or monitored during verification.

In another embodiment illustrated in FIG. 2, verification IP 17 has bind information 36*a*, 36*b*

In yet another embodiment depicted in FIG. 2, port 32 on accessor 9*a* is configured to connect 34 to internal signal 33 from design under test 16.

Another embodiment is shown in FIG. 2 describing Step 74 (FIG. 4) of instantiating the accessor including: Step 20 of analyzing a hierarchy of the device under test, Step 21 of searching an IP associated with an accessor, and Step 22 of instantiating the associated hardware block of the accessor to the design under test.

In another embodiment illustrated in FIG. 2, shows interface 28 intercepting 29 verification IP and probing 43 an assertion. Error 46 is detected in the verification IP and debugged 48 the error in the verification IP.

In yet another embodiment depicted in FIG. 2, provides for the step of accessing an associated hardware block being automatically netlisted 24. As a result, other verification teams that will work at the sub-system may reuse the work.

FIG. 2 best depicts an alternate embodiment having the step of accessing at least one internal signal 33 of design under test 15 with accessor 9*a*, 9*b*. Accessor 9*a*, 9*b* having information container 39 configured to store a hierarchical path to at least one internal signal in a target language, port 32 configured to read and/or write at least one internal signal 33 from said target language, and port 32 is in communication with information container 39. It is within the scope of this invention for vendor extension 75 to connect port 32 to information container 39.

In another embodiment illustrated in FIG. 2, monitor 26 may be provided. Monitor 26 is in communication with hardware block 9*a* of said verification IP 17. Monitor 26 is configured to measure and/or drive 27 an internal signal of the functional component.

To enable automated creation of a testbench for a DUT (component, a sub-system or a system), a software is reading the machine-readable description of the component, subsystem, or system. Then for each functional component inside the DUT (possibly the DUT itself), the corresponding accessor is instantiated if it exists.

Testbench Configuration. The user can also configure the bind information in the "accessor" instances according to needs.

Testbench Consistency Check. Static checks can be included in the flow to be run on the testbench for early detection of issues. In one embodiment, components are described in IP-XACT standard which comes with a list of compliance rules. Additional user checks can be executed by the software.

Testbench Generation. All the connections that need to happen to the internal signals of the functional component are automatically taken into account and correctly generated in the netlist of the testbench. In one embodiment of the invention, the resulting testbench is generated using the SystemVerilog language, and the corresponding statements to instantiate verification components and bind them to a functional component, including binding of signal internal to the functional component.

Testbench Maintenance. When new revisions of the DUT or of its sub-elements or their associated accessors are available, the testbench is updated accordingly by the software.

Note: the complete creation of the testbench might require additional operations, such as programming stimulus generators, instantiating additional verification components not directly related to a functional component and so on —which are not part of the invention.

Benefits. This process significantly reduces the complexity of creating a testbench for system with many components, which have been developed by different teams, bought externally etc. It also reduces the possibility of making mistakes by associating automatically functional components and accessor components.

The benefits of this invention include: standardizing exchanges between development and validation teams. Strong semantic data, versioning, integration into any IP-XACT flow drastically reduce complexity of creating testbench. And facilitating the update of new revisions of functional or verification components, all differences and/or automatic updates are immediately handled by standard IP-XACT.

The minimum basic components/steps of the invention are included in a process as described that can be implemented in software running on a computer. Here are the steps of the process:
  (1) Get the machine-readable description for functional component from development team.
  (2) If functional component is not provided with accessor: creation of the verification component "accessor"

related to the functional component (add references to internal signals, add binds, . . . ).

(3) Test Bench creation:

(a) Instantiate the accessor corresponding to the DUT. If several DUT exist in same testbench, associate each accessor to its corresponding DUT.

(b) Configure the accessors.

(c) [Optional] Run different checkers to ensure correctness of testbench.

(d) Generate the testbench net list: instantiation and connection of all components, functional and verification related.

Certain methods according to the various aspects of the invention may be performed by instructions that are stored upon a non-transitory computer readable medium. The non-transitory computer readable medium stores code including instructions that, if executed by one or more processors, would cause a system or computer to perform steps of the method described herein. The non-transitory computer readable medium includes: a rotating magnetic disk, a rotating optical disk, a flash random access memory (RAM) chip, and other mechanically moving or solid-state storage media. Any type of computer-readable medium is appropriate for storing code comprising instructions according to various example.

Certain examples have been described herein and it will be noted that different combinations of different components from different examples may be possible. Salient features are presented to better explain examples; however, it is clear that certain features may be added, modified, and/or omitted without modifying the functional aspects of these examples as described.

Some examples are one or more non-transitory computer readable media arranged to store such instructions for methods described herein. Whatever machine holds non-transitory computer readable media comprising any of the necessary code may implement an example. Some examples may be implemented as: physical devices such as semiconductor chips; hardware description language representations of the logical or functional behavior of such devices; and one or more non-transitory computer readable media arranged to store such hardware description language representations. Descriptions herein reciting principles, aspects, and embodiments encompass both structural and functional equivalents thereof. Elements described herein as coupled have an effectual relationship realizable by a direct connection or indirectly with one or more other intervening elements.

Practitioners skilled in the art will recognize many modifications and variations. The modifications and variations include any relevant combination of the disclosed features. Descriptions herein reciting principles, aspects, and embodiments encompass both structural and functional equivalents thereof. Elements described herein as "coupled" or "communicatively coupled" have an effectual relationship realizable by a direct connection or indirect connection, which uses one or more other intervening elements. Embodiments described herein as "communicating" or "in communication with" another device, module, or elements include any form of communication or link and include an effectual relationship. For example, a communication link may be established using a wired connection, wireless protocols, near-filed protocols, or RFID.

To the extent that the terms "including", "includes", "having", "has", "with", or variants thereof are used in either the detailed description and the claims, such terms are intended to be inclusive in a similar manner to the term "comprising."

The scope of the invention, therefore, is not intended to be limited to the exemplary embodiments and aspects that are shown and described herein. Rather, the scope and spirit of the invention is embodied by the appended claims.

What is claimed is:

1. A method for design verification of an electronic system, the method comprising:
providing a design under test connected to a verification IP to create a test bench;
providing an interface connected to the verification IP;
providing an assertion retained in an accessor, the assertion is a list of at least one internal signal of an associated hardware block of the verification IP configured to connect to the test bench;
instantiating the accessor; and
accessing at least one internal signal of the design under test with the accessor including:
an information container configured to store a hierarchical path to the at least one internal signal in a target language;
a port, the port configured to read and/or write the at least one internal signal from the target language and the port is in communication with the information container.

2. The method of claim 1 wherein the verification IP having a cover statement.

3. The method of claim 1 wherein the verification IP having an internal reference signal configured to be driven and/or monitored during verification.

4. The method of claim 1 wherein the verification IP having bind information.

5. The method of claim 1 further comprising, wherein a port on the accessor is configured to connect to an internal signal from the design under test.

6. The method of claim 1 wherein the instantiating the accessor includes:
analyzing a hierarchy of the design under test;
searching an IP associated with the accessor; and
instantiating the associated hardware block of the accessor to the design under test.

7. The method of claim 1 wherein the interface intercepting the verification IP and probing the assertion.

8. The method of claim 7 further comprising, detecting an error in the verification IP.

9. The method of claim 8 further comprising, debugging the error in the verification IP.

10. The method of claim 1 further comprising accessing associated hardware block is automatically netlisted.

11. The method of claim 1 wherein a vendor extension connects the port to the information container.

12. The method of claim 1 further comprising providing a monitor, the monitor is in communication with hardware block of the verification IP, the monitor is configured to measure an internal signal of a functional component.

13. A computer-implemented method for creating a test bench for design verification of an electronic system comprising the steps of:
providing a test bench having a design under test, the design under test is electrically connected to a computer processor, the design under test having a functional component, the functional component having a verification feature expressed as an internal signal of the functional component, the test bench having an interface, the interface is in communication with the verification feature, the interface is configured to probe the design under test for an error, whereby, an IP of the design under test is configured to be intercepted by the interface and corrected, through the computer processor, if the error is detected;

providing a first accessor, the first accessor having a port connected to the internal signal of the functional component, the first accessor describes a list, the list having at least one verification-related internal signal of the design under test, whereby, each of the verification-related internal signal is described using a storage container configured to store a hierarchical path to the internal signal in a target language, a port, the port is configured to read and/or write the internal signal from the design under test, the port connects the storage container of the first accessor to the internal signal of the design under test to form a test bench; the first accessor is paired with the design under test;

providing a verification component, the verification component comprising:
  an assertion statement, the assertion statement is configured to document the verification feature of the design under test;
  a cover statement, the cover statement is configured to count a number of times the verification feature of the assertion statement holds or fails; and,
  a second accessor, the second accessor is configured to verify the functional component of the design under test, the accessor is in communication with the assertion statement, the accessor is in communication with the cover statement;

pairing the second accessor of the verification component with the first accessor of the design under test, comprising the steps of:
  analyzing, by a computer processor, a hierarchy of the design under test;
  searching, by a computer processor, an IP associating the second accessor with the first accessor; and,
  instantiating, by a computer processor, the first accessor when the second accessor is associated with the first accessor;

selecting, by a first user, a predetermined internal signal, the first user storing the predetermined internal signal in a database, the database is in electrical communication with the second accessor;

inputting, by the first user, test data into the design under test;

probing, by the interface, the design under test for an error, wherein the IP of the design under test is intercepted by the interface and corrected by a user, through the computer processor, if the error is detected.

14. The computer-implemented method of claim 13 further comprising providing a monitor, the monitor is in electrical communication with the first accessor and the monitor is configured to measure the internal signal of the functional component.

15. The computer-implemented method of claim 13, wherein the second accessor has bind information configured for the instantiation of assertion models when determining functional verification.

16. The computer-implemented method of claim 13, wherein the assertion statement is net listed automatically.

17. The computer-implemented method of claim 13 further comprising requesting additional internal signals, by the computer processor, to facilitate a debug if the error is detected.

18. The computer-implemented method of claim 13, wherein providing a sub-system, whereby, a second user receives additional internal signals and the database from the first user, the second user creates a third accessor from the additional internal signals and the database.

19. A system comprising:
  a memory for storing code;
  a processor in communication with the memory, wherein the processor executes the code and causes the system to:
    provide a design under test connected to a verification IP to create a test bench;
    provide an interface connected to the verification IP;
    provide an assertion retained in an accessor, the assertion is a list of at least one internal signal of an associated hardware block of the verification IP configured to connect to the test bench;
    instantiate the accessor; and
    accessing at least one internal signal of the design under test with the accessor including:
      an information container configured to store a hierarchical path to the at least one internal signal in a target language;
      a port, the port configured to read and/or write the at least one internal signal from the target language and the port is in communication with the information container.

* * * * *